(12) United States Patent
Hageneder et al.

(10) Patent No.: US 9,669,480 B2
(45) Date of Patent: Jun. 6, 2017

(54) SEMICONDUCTOR COMPONENT WITH CHIP FOR THE HIGH-FREQUENCY RANGE

(71) Applicant: Rohde & Schwarz GmbH & Co. KG, Munich (DE)

(72) Inventors: Daniel Hageneder, Boebrach (DE); Martin Kappels, Utting (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 166 days.

(21) Appl. No.: 14/576,442

(22) Filed: Dec. 19, 2014

(65) Prior Publication Data
US 2015/0181712 A1    Jun. 25, 2015

(30) Foreign Application Priority Data
Dec. 20, 2013   (DE) .................. 10 2013 226 989

(51) Int. Cl.
| | |
|---|---|
| H05K 1/00 | (2006.01) |
| B23K 1/00 | (2006.01) |
| H01L 23/00 | (2006.01) |
| B23K 1/008 | (2006.01) |
| H01L 23/043 | (2006.01) |
| H05K 1/02 | (2006.01) |
| H05K 1/14 | (2006.01) |

(Continued)

(52) U.S. Cl.
CPC ............ *B23K 1/0016* (2013.01); *B23K 1/008* (2013.01); *H01L 23/043* (2013.01); *H01L 24/48* (2013.01); *H01L 24/50* (2013.01); *H01L 24/85* (2013.01); *H01L 24/86* (2013.01); *H05K 1/021* (2013.01); *H05K 1/0243* (2013.01); *H05K 1/144* (2013.01); *B23K 2201/42* (2013.01); *H01L 2224/48091* (2013.01); *H01L 2224/48227* (2013.01); *H01L 2224/85815* (2013.01); *H01L 2224/86815* (2013.01); *H01L 2924/00014* (2013.01); *H01L 2924/181* (2013.01); *H05K 1/117* (2013.01); *H05K 2201/041* (2013.01); *H05K 2201/09063* (2013.01); *H05K 2201/09618* (2013.01); *H05K 2201/10409* (2013.01)

(58) Field of Classification Search
CPC ..... H01L 2924/00014; H01L 2924/181; H01L 2224/05599; H01L 2224/45099; H01L 2924/00; H01L 2224/48091; H01L 2224/48227; H01L 2224/85815; H01L 2224/86815; H01L 23/043; H01L 24/48; H01L 24/50
See application file for complete search history.

(56) References Cited

U.S. PATENT DOCUMENTS

| | | | |
|---|---|---|---|
| 4,107,728 A * | 8/1978 | Max ...................... | H01L 23/057 257/664 |
| 2004/0021210 A1 * | 2/2004 | Hosomi .............. | H01L 25/0657 257/686 |

(Continued)

*Primary Examiner* — Yury Semenenko
(74) *Attorney, Agent, or Firm* — Lee & Hayes, PLLC

(57) ABSTRACT

The invention relates to a semiconductor component with a chip, especially with a high-frequency switching circuit. The semiconductor component further comprises a metal body on the chip and a supplementary circuit board. The supplementary circuit board is provided on an underside facing away from the metal body for connection with a printed-circuit board by means of reflow soldering.

10 Claims, 9 Drawing Sheets

(51) Int. Cl.
*B23K 101/42* (2006.01)
*H05K 1/11* (2006.01)

(56) References Cited

U.S. PATENT DOCUMENTS

| | | | |
|---|---|---|---|
| 2004/0145034 A1* | 7/2004 | Fujioka | H01L 23/66 257/664 |
| 2007/0259514 A1* | 11/2007 | Otremba | H01L 23/3107 438/612 |
| 2008/0246547 A1* | 10/2008 | Blednov | H01L 23/66 331/109 |
| 2012/0299656 A1* | 11/2012 | Kaehs | H01L 23/645 330/269 |
| 2013/0010435 A1* | 1/2013 | Ogatsu | H05K 9/0032 361/748 |

* cited by examiner

US 9,669,480 B2

SEMICONDUCTOR COMPONENT WITH CHIP FOR THE HIGH-FREQUENCY RANGE

RELATED APPLICATION

This application claims priority to German Patent Application No. 10 2013 226 989.7 filed on Dec. 20, 2013, which is hereby incorporated by reference.

FIELD

The present invention relates to a semiconductor component with a chip, especially with a high-frequency switching circuit, and a printed-circuit board fitted with the component, a method for the manufacture of the component and a method for fitting a printed-circuit board with the component.

BACKGROUND

In high-frequency switching circuits, typical control or signal frequencies are disposed approximately within the microwave range, that is, between 300 MHz (megahertz) and 300 GHz. Such switching circuits are used in different fields, for example, in power amplification, low-noise amplification, for high-frequency switches and so on. Switching circuits can be embodied as integrated circuits, that is, for example, in the form of one or more chips. ICs of this kind can be embodied, for example, as MMICs ("Monolithic Microwave ICs"), in which active and passive components are realised on a single semiconductor substrate.

For the embedding of general integrated circuits or chips in relatively large components, it is already known, for example, that at least one chip can be accommodated in a housing. The resulting component or "package", that is, the housing with the chip, is then assembled on a printed-circuit board. Many different packaging solutions are known. For example, modern packages frequently no longer have any wire connections, but are provided as SMDs ("surface-mounted devices") with connecting elements capable of direct soldering, which allow a direct soldering of the package or respectively component onto the printed-circuit board, for example, by means of SMT ("surface-mounting technology"). This is associated with opportunities for automated fitting and mounting on the printed-circuit board, for example, using reflow soldering or re-melting soldering ("reflow soldering"). The extensive automation allows cost-favourable manufacturing methods.

The following can be named as examples of known packaging solutions in the SMD/SMT field: QFN ("Quad Flat No Leads Package"), wherein the electrical connections are integrated flush in a underside of the housing; BGA ("Ball Grid Array"), wherein the terminals are provided in the form of solder beads in a grid on one side of the housing and the beads are connected with contacts on the printed-circuit board, for example, by means of reflow soldering; eWLB ("embedded Wafer Level Ball Grid Array"), wherein the housing terminals are present on a synthetically manufactured wafer made from the chip and a moulding compound; and further developments of the BGA technology such as CSP ("Chip Scale Package"), etc.

Packaging approaches such as those named above are suitable for the embedding of high-frequency chips in relatively large component groups only with some reservations. For example, high-frequency switching circuits can provide considerable thermal-power losses during operation. With the known packaging solutions, an adequate heat removal is not possible without difficulty.

Additionally or alternatively, resonators may be required for high-frequency components or respectively switching circuits, which, in the case of the known packaging solutions, cannot be provided in the required manner and/or in a cost-favourable manner.

Various special packaging solutions are known for the field of high-frequency chips; these generally relate to flange housings. For example, it is known that a cooling element, for example, made from gold-plated copper, can be bonded to a laminate frame which surrounds the chip. Connecting surfaces guided outwards are provided on the laminate. The laminate together with mounted connecting lines and the chip are mechanically protected by a cap. For assembly, a recess must be provided in the printed-circuit board in order to receive the cooling element. The component is assembled by screwing the cooling element into the recess with the printed-circuit board. A heat removal from the chip is achieved via the component's own cooling element, the printed-circuit board and, for example, further cooling elements on the rear side of the printed-circuit board. The electrical contact is made manually by soldering the terminals to corresponding connecting surfaces of the printed-circuit board.

With other methods, the electrical contacting takes place in a manual process by means of bonded, soldered or welded tapes, strips or bonding wires. Alternatively, an appropriately mounted compression element with conductive structure can be used for the contacting by means of corresponding clamping. The compression element is screwed to a stabilising cooling element.

By comparison with the SMD solutions described above, these special approaches for the embedding of high-frequency chips offer an improved thermal connection since the package has at its disposal, for example, its own cooling element for heat removal via the printed-circuit board. However, the lack of SMD capability counteracts this improved heat removal.

DE 10 2010 009 984 A1 describes a printed-circuit board backed with a cooling element. A recess in the printed-circuit board corresponds with an indentation in the cooling element. An amplifier component, which is screwed to the cooling element via screw connections, is arranged in the indentation. An automatic fitting of the printed-circuit board with the component and a reflow soldering are possible, but the component and the cooling element must be screwed together manually.

One object of the present invention is to propose a structure for the embedding of switching circuits which, on the one hand, allows a heat removal which is optimised with regard to the assembly and/or operation, for example, of high-frequency switching circuits, and, on the other hand, which allows automation in the fitting and or the electrical connection to a printed-circuit board.

SUMMARY OF THE INVENTION

According to the invention, a semiconductor component is proposed, which comprises a metal body on at least one chip and a supplementary circuit board. The supplementary circuit board is provided on an underside facing away from the metal body for connection with a printed-circuit board by means of soldering, especially reflow soldering.

The metal body can be embodied as a metallic carrier for the chip. The metal body can serve for the attachment of the chip. The metal body can provide one or more openings, boreholes or through perforations in order to attach the component to the printed-circuit board, for example, by means of screw connection. A plurality of screw holes can be provided in order to allow different screw connections. For example, six screw holes can be provided in order to implement a screw connection with four screws or a screw connection with two screws. In embodiments of components according to the invention, the metal body is embodied as a part of a flange housing.

The metal body can be embodied for heat removal from the chip, for example, in order to absorb and divert heat during the operation of the chip. In embodiments of components according to the invention, the metal body can face away from the printed-circuit board in the assembled condition of the component, in order to optimise heat removal, in which the flow of heat does not take place via the printed-circuit board. With some embodiments, the metal body is made from one material or several materials which comprise a metal with high thermal conductivity, for example, copper or aluminium. The metal body can contain non-metallic parts or respectively materials, such as diamond, which can be used, for example, for non-metallic coatings.

The metal body can be solid or can contain one or more hollow cavities, and can be embodied, for example, as a heat pipe or can comprise a heat pipe. With some embodiments, a thickness of a substantially flat metal body can be determined by the required properties, such as mechanical stability, thermal absorption capacity or respectively thermal conductivity, dimensions for embedding the mounted component in relatively larger component groups, etc.

The component can comprise one chip or a plurality of chips. A chip can comprise one or more integrated electrical and/or electronic circuits or switching circuits. For example, a chip can comprise a high-frequency switching circuit. This term "high-frequency" can cover a range from 10 GHz or more, for example, from 20 GHz to 40 GHz or more, for example, up to 50 GHz or more. The chip can comprise, for example, an MMIC.

In given embodiments, the chip can comprise a substrate based on a material, such as silicon carbide (SiC), silicon, silicon germanium, etc. Active and/or passive elements in the circuit can be formed, for example, from gallium nitride (GaN), and/or from gallium arsenide (GaAs), indium phosphide (InP), silicon germanium (SiGe). For example, gold solder (Au/Sn) can be used as a solder. The chip can be provided with a cover, such as a lid or a cap, which can be made from a non-metallic or metallic material. The cover can be supported on the metal body, the supplementary circuit board, the chip or the printed-circuit board (main board).

Unless otherwise specified, in the case of a printed-circuit board (main printed-circuit board, mainboard, main printed board) with component assembled or to be assembled, the printed-circuit board is regarded as "below", and the component as a structure fitted "on" the printed-circuit board; in this context, it is not relevant on which side of the mainboard the component is fitted. If, within this reference system, the metal body is disposed "on" the chip, this should be understood to mean that the metal body is disposed above the chip. Furthermore, the metal body is disposed above the printed-circuit board. This does not exclude the possibility that the chip can be disposed at the level of or respectively at or below the level of the printed-circuit board. For example, a chip can be accommodated entirely or partially in a recess of the printed-circuit board; this can relate, for example, to components with a vertical extension or to a cover on the chip.

The supplementary circuit board can be embodied as a small piece of printed-circuit board, a piece of board, an additional board etc., or can be produced directly on the metal body. With given embodiments, the supplementary circuit board can comprise a partial circuit board, a sub-component group and/or a sub-mount, wherein, for example, a plurality of chips and/or active or respectively passive components can be present on the supplementary circuit board. The supplementary circuit board can comprise a printed-circuit board material, circuit board material, but also a laminate material and/or other appropriate substrate material. Accordingly, the supplementary circuit board can also be embodied as a laminate layer, as a laminate frame etc., or can comprise combinations of the named embodiments.

The supplementary circuit board can be structured in one layer or in multiple layers or respectively multilayers. With one embodiment, the supplementary circuit board is built up in at least two layers and comprises a plated insulator, that is, an internal layer made from an insulating material, wherein the layer is plated at least partially on at least one side. The plating can be disposed on the underside of the supplementary circuit board, that is, on the side of the supplementary circuit board facing away from the metal body. The plating can be embodied over the surface area. Additionally or alternatively, the plating can form lines, such as strip lines. The plating can comprise, for example, a gold-plating. On the upper side of the supplementary circuit board, a layer can be provided for the attachment of the supplementary circuit board to the metal body, for example, a bond layer. The chip can be fastened to the metal body or attached to the supplementary circuit board, that is, to its underside. In the case of several chips, one chip or several chips can be attached to the metal body, and one chip or several chips can be attached to the supplementary circuit board. In given embodiments, the supplementary circuit board surrounds the chip at least partially like a frame. The supplementary circuit board can surround the chip, for example, in an annular shape. Accordingly, the supplementary circuit board can have a recess, or also several recesses. In addition or as an alternative to the chip or the chips, the supplementary circuit board can be fitted on the underside with one or more semiconductor components, these can be active and/or passive components.

Many embodiments of a component according to the invention can comprise two or more separate supplementary circuit boards, for example, for the formation of recesses. With another embodiment, lines are embodied on a first supplementary circuit board for contacting the printed-circuit board, and a second supplementary circuit board serves as a carrier of one or more chips and/or components.

With some embodiments, not only one chip but several chips with relevant heat removal resources are accommodated within one component. In this context, the metal body provides correspondingly larger dimensions, for receiving the chip, for its assembly and/or for heat removal, than a metal body of a component with only one chip.

These embodiments can comprise at least one supplementary circuit board which is provided for the connection of at least two of the chips to the printed-circuit board by means of (reflow) soldering. With some embodiments, the component comprises precisely one supplementary circuit board, which is provided for the connection of all available chips to the printed-circuit board by means of (reflow) soldering.

With these embodiments, a dimension or dimensions of the metal body and/or of the at least one supplementary circuit board can be comparable with a dimension or dimensions of the main printed-circuit board, or can be larger, for example, approximately 30%, 50%, 70%, 100% or 120%.

For the connection of the printed-circuit board, at least one soldering region can be provided on the underside of the supplementary circuit board for the mechanical attachment of the component to the printed-circuit board by means of reflow soldering. The soldering region can comprise at least one soldering area extending over the surface and/or at least one punctual soldering position or respectively one soldering point. The soldering region can, for example, be free from conductor lines and components. The soldering region can be prepared for receiving solder, for example, in that indentations and/or projections are embodied, for example, in a printed-circuit board material, a coating or plating etc.

Alternatively or additionally, an attachment of the component to the printed-circuit board can be provided, for example, through a screw connection. Embodiments of components according to the invention can provide boreholes, perforations, such as through perforations, openings, recesses etc. in the metal body and/or the supplementary circuit board, for example, in order to allow a screw connection.

The supplementary circuit board can provide at least one connecting tab for the electrical contacting of the component to the printed-circuit board and/or for the mechanical connection of the component to the printed-circuit board. The connecting tab can be embodied in one piece with the supplementary circuit board, for example, through corresponding shaping of the supplementary circuit board. The connecting tab can be embodied, for example, in the shape of a flap, tongue or strip and/or in the shape of a rail or loop on the supplementary circuit board.

The connecting tab can be bendable perpendicular to a surface of the printed-circuit board, that is, for example, in an elastically movable manner. A corresponding flexibility can be achieved with adequate mechanical stability, for example, by selecting a printed-circuit board material of appropriate thickness for the supplementary circuit board.

The supplementary circuit board can cover an underside of the metal body, that is, a side of the metal body facing completely or partially towards the printed-circuit board. Additionally or alternatively, the supplementary circuit board can project beyond the underside of the metal body, for example, in the region of the connecting tab or of the connecting tabs. The metal body can expose a connecting tab of the supplementary circuit board, for example, by means of a recess.

The connecting tab can comprise an insulating material plated on the underside and/or upper side. The plating can, for example, form conductor lines on the underside of the tab. This upper side can be exposed, for example, if the upper side of the connecting tab is not covered by the metal body.

For connection to the printed-circuit board, at least one reflow soldering region can be provided on the underside of the connecting tab, for example, in the form of one or more soldering positions or soldering points. These can serve for soldering to corresponding positions or points on the printed-circuit board. In this manner, for example, a signal routing between component and printed-circuit board, the connection to an operating voltage, a common ground potential etc. can be realised. Alternative contacting possibilities can comprise, for example, bonding methods, by means of which bonding wires or bonding tapes are provided between supplementary circuit board or respectively connecting tab and printed-circuit board.

With many embodiments of components according to the invention, the connecting tab provides at least one strip line. For signal routing, this can be soldered to a corresponding strip line on the printed-circuit board, which can be achieved via one soldering point or several soldering points. Additionally or alternatively, a soldering position or several soldering positions can be provided for the realisation of a ground connection between component and printed-circuit board. By means of combinations of these embodiments, for example, GCPW ("Grounded Coplanar Waveguide")-GCPW-transitions can be realised between component and printed-circuit board.

Embodiments of a component or package according to the invention can be used together with further elements and/or components for the construction of further component groups. An embodiment of a component according to the invention can comprise, for example, an ASIC ("Application Specific Integrated Circuit") package, by means of which an ASIC embodied as an MMIC can be embedded.

Furthermore, a printed-circuit board which comprises a semiconductor component as described above is proposed according to the invention. The component can be attached to the printed-circuit board by means of reflow soldering. For example, the supplementary circuit board of the semiconductor component can be connected to the printed-circuit board by soldering. Additionally or alternatively, the component can be fastened to the printed-circuit board, for example, by screw connection.

The supplementary circuit board can be covered between the metal body of the component and the printed-circuit board, but parts of the supplementary circuit board can be exposed, for example, at least one connecting tab of the component can be exposed on the printed-circuit board, wherein the component is electrically and/or mechanically connected to the printed-circuit board, or respectively contacted with the latter by means of the connecting tab.

The chip and/or further or different surface-mounted elements of the metal body or of the supplementary circuit board can be accommodated in a recess of the printed-circuit board; the surface-mounted elements can relate, for example, to a cover for the chips and/or components on the supplementary circuit board. Instead of a recess, several recesses can also be present. The recess can be provided in such a manner that the surface-mounted elements of the component are accommodated in the recess with a spacing distance from the printed-circuit board and/or other components of the printed-circuit board or of a component group to which the printed-circuit board belongs.

The printed-circuit board with component can be accommodated in a housing. The housing can be entirely or partially made of metal. The housing can comprise two or more parts, such as a lid and a base, which, after receiving the printed-circuit board are screw connected to one another and/or connected together in another manner. In particular, the housing can be disposed in a thermal contact with the metal body of the component in the connected condition. For this purpose, a thermally conductive material, such as a thermal conduction pad, a thermal conduction paste and/or a thermal-conduction bonding, can be provided, for example, between the metal body and the housing; for instance, appropriate polymer materials, such as thermoplastic materials or other materials with a thermal conductivity suitable for the operation of a high-frequency switching circuit, can be used. Additionally or alternatively to the heat removal purposes described, the housing can also be provided for the screening of a high-frequency switching circuit.

According to the invention, a method for the manufacture of a semiconductor component is further proposed. The method comprises the provision of a metal body; the attachment of a chip on the metal body; and the attachment of a supplementary circuit board on an attachment surface of the metal body.

In the case of alternative methods, the chip is or becomes attached to the supplementary circuit board, and/or the supplementary circuit board is first attached to the metal body. Adhesive and/or solder can be used for the attachment, for example, of the supplementary circuit board to the metal body. In general, plating, the provision of conductor lines etc. on an underside of the supplementary circuit board can be implemented before it is attached to the metal body and/or after.

Embodiments of the method according to the invention can further comprise connecting the chip electrically to lines on the supplementary circuit board. For this purpose, for example, a bonding method can be used. For example, bonding wires or bonding tapes can be attached between chip and supplementary circuit board.

The method can further comprise providing the chip with a cover, for example a lid made from synthetic material for the mechanical protection of the chip. The cover can be attached, for example, to the supplementary circuit board and/or to the metal body. Additionally or alternatively, an assembly can take place, in which the supplementary circuit board is fitted with at least one semiconductor component on an underside facing away from the metal body. In the case of covering the chip and/or assembly of the supplementary circuit board, SMT methods can be used.

The supplementary circuit board can be provided on an underside facing away from the metal body for connection to a printed-circuit board by means of reflow soldering. Corresponding soldering regions, such as soldering surfaces or soldering positions or respectively soldering points would have to be excluded from an assembly. Optionally, the soldering regions should be prepared for reflow soldering, for example, at occurring temperatures, through a plating or similar.

The metal body can be embodied to be substantially flat, which means that the metal body provides two substantially mutually opposite main faces or respectively sides. With regard to the attachment of the component to the printed-circuit board provided during the course of the method, one of the two main faces, which faces away from the printed-circuit board, represents an upper side or respectively a top side of the metal body, and the other main face represents the lower side or respectively the underside. The attachment surface for the attachment of the supplementary circuit board can occupy or constitute a substantial part of the underside of the metal body.

With some embodiments, the supplementary circuit board can be embodied to cover the underside of the metal body completely. Additionally or alternatively, the supplementary circuit board to be attached to the metal body can provide at least one connecting tab which projects beyond the attachment surface of the metal body. The connecting tab can be embodied, for example, by two parallel slots in the supplementary circuit board, so that the region between the slots embodies a connecting tab in the form of a flap.

Furthermore, a method for the fitting of a printed-circuit board with a semiconductor component, for example, with an ASIC package, is proposed according to the invention. In the case of this method, the fitting of the printed-circuit board with the component and/or the assembly of the component on the printed-circuit board can be implemented at least partially in an automated manner. With some embodiments of the method according to the invention, SMT methods can be used. The method can also contain the integration of printed-circuit board with assembled component into a component group.

The method comprises the application of a solder paste to at least one soldering region of the printed-circuit board, for example, by means of a paste-printing method. The soldering region can comprise one or more soldering surfaces for soldering the face of the component to the printed-circuit board, and/or can comprise one or more punctual soldering positions. The soldering region can be provided for mechanical and/or electrical connection of the component. Additionally or alternatively, soldering paste can be applied to at least one soldering region on the underside of a supplementary circuit board on the component.

Following this, the printed-circuit board is fitted with at least one component. The method can comprise, for example, the fitting of a plurality of printed-circuit boards with a corresponding plurality of components. The semiconductor component can be supplied for fitting, for example, in taped form. Accordingly, a fitting can be implemented in such a manner that a metal body of the component faces away from the printed-circuit board and a chip and a supplementary circuit board of the component face towards the printed-circuit board. In the case of the fitting, a soldering region on an underside of the supplementary circuit board is applied to a soldering region of the printed-circuit board provided for it. At least one of the soldering regions is covered with solder, for example, soldering paste. The component adheres to the printed-circuit board by means of the soldering paste.

The printed-circuit board with the component applied is then supplied to a reflow process. The process comprises a reflow soldering. In this context, the component can be mechanically and/or electrically connected or respectively contacted to the printed-circuit board via a soldering of soldering regions on the printed-circuit board and on the supplementary circuit board of the component.

Within a dedicated process, or at least in a step disposed upstream of the fitting, the printed-circuit board can be provided with at least one recess, for example, by milling. The recess can be provided on the underside of the metal body and/or the underside of the supplementary circuit board to receive surface-mounted elements. On the one hand, the recess in the printed-circuit board and, on the other hand, the dimensions of the component relate to one another in such a manner in this context that the component can be attached sufficiently securely to the printed-circuit board. With some embodiments, soldering surfaces and/or soldering points are provided adjacent to a recess or to several recesses in order to receive surface-mounted elements of the component for the mechanical and/or electrical connection of the component. Additionally or alternatively, a screw connection of the component to the printed-circuit board can be provided.

In a further process step and/or a downstream process, the printed-circuit board with the assembled component can be accommodated in a housing. In this context, a material with high thermal conductivity can be provided between the metal body and the housing in order to ensure a required thermal connection of the component to the housing.

Within the invention, a structural form is proposed for a semiconductor component, for example, a package which is suitable for an automatic fitting of a printed-circuit board, for instance, within the framework of an SMT process. At the same time, the component offers the possibility of an optimised thermal coupling for the removal of high power losses, for example, to external cooling elements, which makes the component particularly suitable for an embedding, for example, of high-frequency switching circuits. In embodiments of components according to the invention, a substantial part of the flow of heat passes via the metal body not via the printed-circuit board, for example, if the metal body faces away from the printed-circuit board in the assembled condition of the component. Here, with reference to a component attached "on" a printed-circuit board, a heat removal can preferably take place upwards, namely, from the chip to the component's own metal body, that is, away from the printed-circuit board. In this manner, the heat removal can occur more efficiently and/or with better control than in the case of a heat removal which occurs substantially through the application board. A control can take place, for example, through an appropriate design of the metal body, connection to the external cooling fittings and/or design of external cooling fittings. A heating of the printed-circuit board is minimised. Cooling elements which are attached below the printed-circuit board may be dispensed with in some circumstances.

In the case of embodiments of components according to the invention, if surface-mounted elements are introduced on the chip and/or the supplementary circuit board into a recess of the printed-circuit board with a spacing distance, the component is thermally insulated downwards, that is, here also, the heat removal preferably occurs upwards. This can also contribute to the efficiency and/or controllability of the heat removal.

By comparison with known structural forms, in the case of the component according to the invention, an "inverted" package is proposed in which the metal body is disposed above the chip in the assembled condition. As a result of the fact that the chip and the supplementary circuit board are disposed on the underside of the metal body, the supplementary circuit board is available for connection to the printed-circuit board, wherein this connection can be made in an automated manner, for example, through reflow soldering.

A protective housing for the supplementary circuit board, chip and/or connecting lines etc. can be dispensed with, insofar as these components are disposed between metal body and printed-circuit board and/or within a cut-out, milled recess etc. of the printed-circuit board and are accordingly protected, for example, from mechanical damage. However, a covering of the chip can be advantageous for protection from mechanical damage during fitting and/or assembly on the printed-circuit board.

Known structural forms with cooling elements disposed below, which must optionally be introduced into a recess of the printed-circuit board, are suitable for reflow methods only with reservations. Here, the cooling elements must generally first be screw connected for attachment. After this, bonding methods are implemented to realise the electrical contacting of the chip. However, a downstream soldering after the screw connection can lead to mechanical stresses during operation; as a result, the soldered connections become prematurely loose, that is, the operating life of corresponding component groups is limited and/or manufacturing methods in which the component must first be screw connected and then soldered, must take these technical difficulties into consideration and therefore become more expensive.

By contrast, embodiments of components according to the invention can first be soldered to the printed-circuit board and then screw connected, if the latter step is indeed regarded as necessary, that is, a screw connection can take place downstream or can be dispensed with. Accordingly, the difficulties named above do not initially occur so that more cost-favourable manufacturing methods are possible. Moreover, since a substantial heat removal occurs upwards, an efficient thermal coupling of the component can occur, for example, by pressing the component via the metal body against the printed-circuit board, which can make a screw connection unnecessary.

Additionally or alternatively, embodiments of components according to the invention are readily suitable for cost-favourable reflow processes, because the coupling to the printed-circuit board takes place via the supplementary circuit board. The heat capacity of a soldering position can be kept low as a result of the fact that this position of the supplementary circuit board is exposed by the metal body. Accordingly, a reflow process can be implemented with favourable parameter values with reference to temperature profile, duration of action etc.

As a result of some or all of the aspects discussed above or elsewhere, embodiments of components according to the invention are suitable for a reliable automatic fitting, optionally together with other, for example, SMD-capable components, at correspondingly low cost per item. Embodiments of components according to the invention can, for example, be used in known SMD reflow processes. Expenditure on manual, and therefore cost intensive micro-assembly for the integration of the component can be minimised or completely eliminated. If micro-assembly steps are necessary, these can be restricted to the component itself.

Embodiments of components according to the invention are compatible with the method of construction of previous components or respectively packages, for example, high-frequency packages, for instance, with regard to dimensions such as structural height etc. Embodiments of components according to the invention can be compatible, for example, with standard SMD components and, for these and/or for other reasons, can be processed using conventional SMT processes; in other words, they require no special treatment, for example, for fitting and/or assembly.

In the case of embodiments of components according to the invention, the supplementary circuit boards comprise elastic connecting tabs. As a result, thermal expansion effects, such as can occur with the use of materials with different CTE ("Coefficient of Thermal Expansion") in the soldering process and/or during operation, are compensated. With correspondingly reduced mechanical stresses, the operating lives of soldered contacts, and accordingly the operating lives of mechanical and/or electrical connections between component and printed-circuit board which serve, for example, for the mechanical fastening, signal routing, contacting with an operating voltage, ground connection etc., are prolonged.

The connecting tabs can project beyond the metal body or be exposed by the metal body in another manner. The resulting thermal decoupling leads to a reduced heat capacity of the connecting tab. Accordingly, in the soldering process, a reliable soldering, for example, of the soldered contacts of the connecting tab, can be achieved with a standard soldering technique, that is, special techniques, such as special temperature control, can be dispensed with. This can contribute to a cost reduction.

BRIEF DESCRIPTION OF THE DRAWINGS

In the following, further aspects and advantages of the invention are described merely by way of example with reference to the Figs. and the attached drawings. The drawings show.

DETAILED DESCRIPTION

Figure 1:
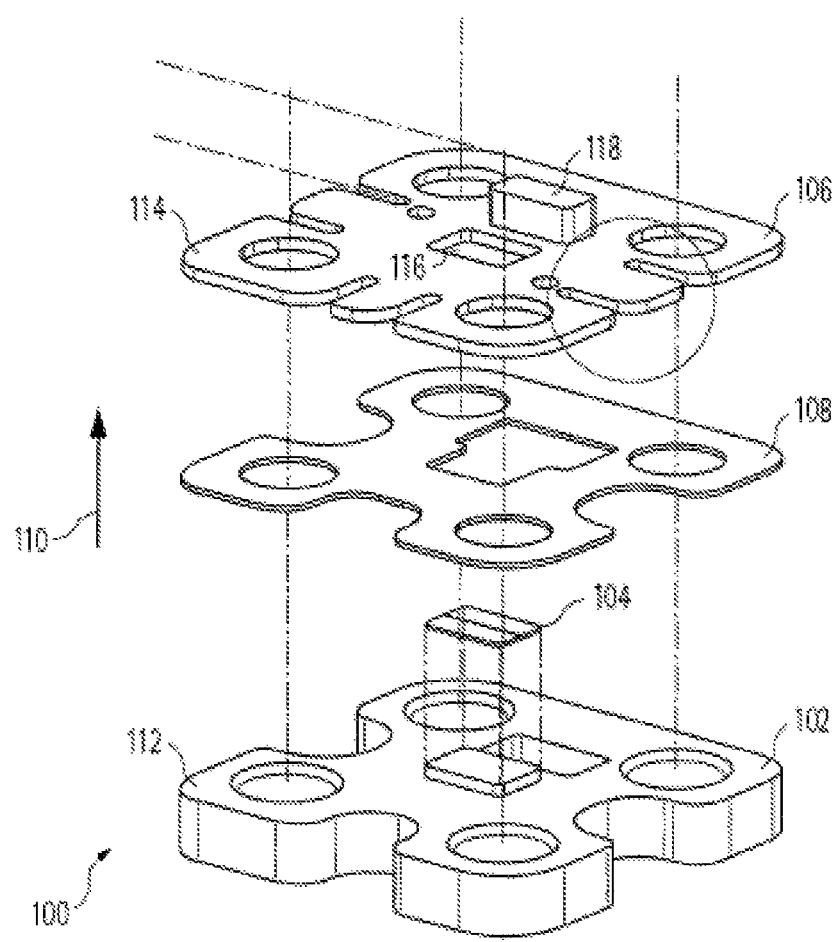
FIG. 1 a semiconductor component according to an exemplary embodiment of the invention in the form of an exploded diagram.

In the form of an exploded diagram, FIG. 1 visualises the construction of a semiconductor component 100 according to an exemplary embodiment of the invention. The component 100 comprises a metal body 102, a chip 104 and a supplementary circuit board 106 which is attached by means of a bond layer 108 to the metal body 102.

For purposes of explanation, it is assumed that the chip 104 is an active chip with high thermal output during operation. Further chips or components with comparatively insubstantial thermal output can be additionally present and will not be discussed in further detail. The chip 104 can implement, for example, a high-frequency application and, in particular, can be an MMIC. With other exemplary embodiments, several chips can also be provided on a metal body and or a supplementary circuit board or several supplementary circuit boards.

In the assembled condition, the component 100 is provided in the form of a package, for example, an ASIC package, for arrangement on a printed-circuit board and/or for installation within a larger component group. With reference to an assembly of the component 100 on a printed-circuit board, the arrow 110 indicates a direction towards the printed-circuit board. With reference to the view of the component 100 in FIG. 1, the component 100 is placed on the printed-circuit board "upside down", that is, the metal body 102 then bears the chip 104 upside down. For this reason, the side 112 of the metal body 102 is designated as the "underside" of the metal body 102, and the side 114 of the supplementary circuit board 106 is designated as the "underside" of the supplementary circuit board 106.

The supplementary circuit board 106 can also be attached, additionally or alternatively, to the metal body 102, for example, by means of soldering, instead of by the bond layer 108. All of the attachment steps can be implemented, for example, in an SMT process. The supplementary circuit board 106 provides a recess 116 in which the chip 104 is accommodated in the assembled condition of the component 100, that is, the supplementary circuit board 106 then forms a frame or ring around the chip 104. The supplementary circuit board 106 provides surface-mounted elements 118, which can be resistors, capacitors or similar passive components, and/or diodes, transistors or other active components.

Figure 2:
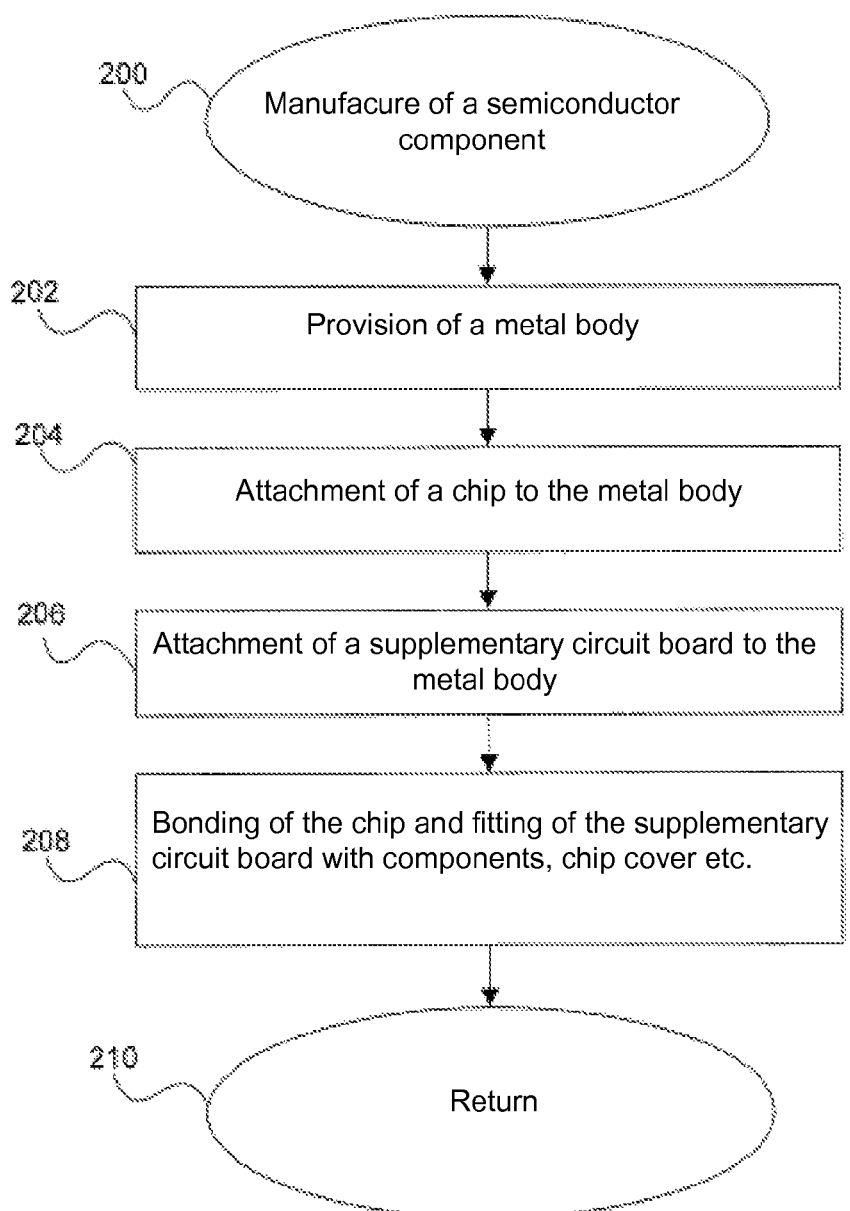
FIG. 2 a flow chart visualising an exemplary method for the manufacture of the component from FIG. 1.

An example for a manufacturing method 200 for the manufacture of the component 100 is described below with reference to the flow chart of FIG. 2.

Figure 3:
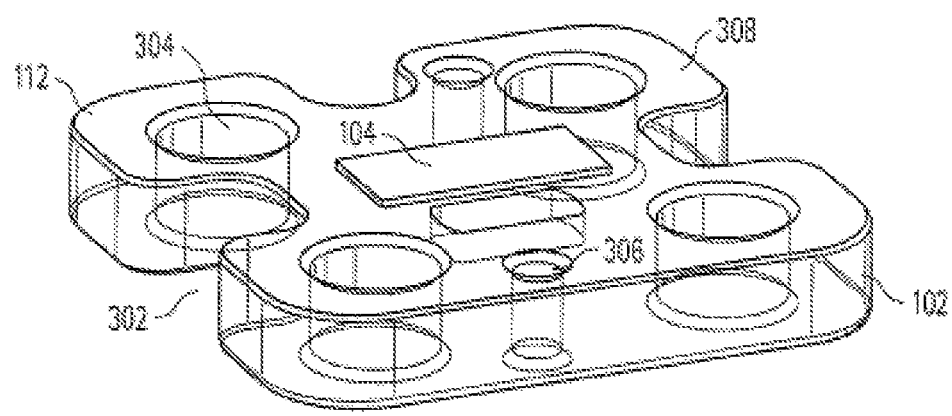
FIG. 3 a first partial schematic view of the construction of the component from FIG. 1.

In step 202, the metal body 102 is provided. In step 204, the chip 104 is attached to the metal body 102. FIG. 3 shows a perspective view of the metal body 102 with the chip 104 illustrated schematically.

The metal body 102 can be made, for example, of copper. Additionally or alternatively, in order to achieve, for example, a desired high thermal conductivity and/or mechanical stability, a different metal can be used, for example, aluminium, combinations of these, one or more alloys etc. The metal body 102 can be manufactured, for example, by milling. The metal body 102 can be entirely or partially coated; for example, the underside 112 can be coated with gold.

The metal body 102 can be provided with a recess or several recesses 302, the significance of which will be explained in due course. The metal body 102 can be provided with boreholes or openings 304, 306. In the example, a set of four boreholes 304 is provided for a screw connection of the component on a printed-circuit board. As an alternative, a second screw connection can be provided, for which a set of two alternative boreholes 306 is provided. Instead of the circular openings 304, 306, for example, appropriate partially circular recesses can be provided at the edge of the metal body 102 for a screw connection or other printed-circuit board fastening. In yet further, alternative exemplary embodiments, a screw connection is not provided, so that corresponding boreholes or openings can also be dispensed with.

The chip 104 can comprise, for example, an SiC substrate. The switching circuit or switching circuits of the chip 104 can comprise, for example, a high-frequency circuit which can be embodied in GaN. Soldered connections can also be embodied with AuSn. Substrate materials and/or circuit materials different from those named here are well known to the person skilled in the art. The chip 104 can be soldered and/or bonded to the metal body 102.

Figure 4:
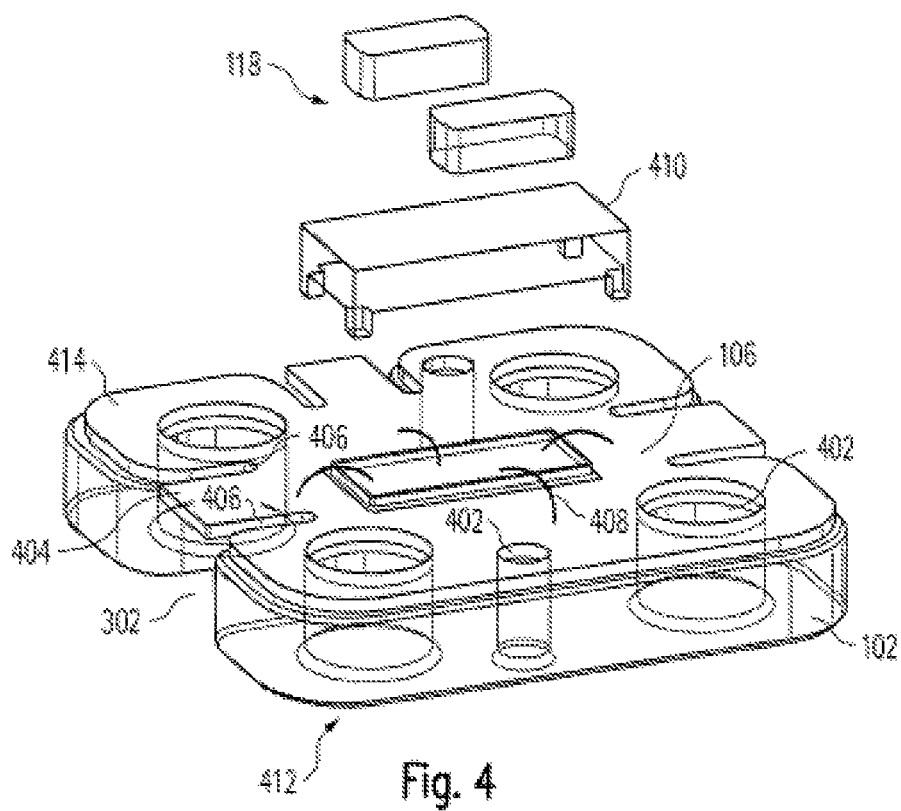
FIG. 4 a second partial schematic view of the construction of the component from FIG. 1.

In step 206, the supplementary circuit board 106 is attached to the metal body 102. FIG. 4 shows a perspective view of the metal body 102 with the chip 104 and applied supplementary circuit board 106.

The supplementary circuit board 106 is bonded by means of the adhesive 108 (FIG. 1) onto the metal body 102. The entire free surface of the metal body 102 can serve, for example, substantially, as the attachment surface 308 (FIG. 3) on the metal body 102 for the attachment of the supplementary circuit board 106, if the supplementary circuit board 106 covers the entire underside 112 of the metal body 102 apart from an area occupied by the chip 104 and the boreholes 304, 306.

It should be noted that in the case of other exemplary embodiments, one or more active chips can be attached to the supplementary circuit board instead of directly on the metal body. The discussion should be applied accordingly for these exemplary embodiments.

The supplementary circuit board provides openings 402 corresponding to the boreholes 304, 306. In the region of the recesses 302 of the metal body 102, the supplementary circuit board 106 provides flaps, tongues or respectively tabs 404. For reasons of clarity, these structures are designated as "connecting tabs" or "soldering tabs", although, during the manufacturing method for the component 100, the conditions for an electrical contact and/or a mechanical connection to a printed-circuit board are not yet fulfilled.

The connecting tabs 404 are formed in the supplementary circuit board 106 through the provision of slots 406. A flexible or elastic property of the tabs 404 in the direction towards or away from the printed-circuit board can be adjusted in a desired manner through the length of the slots 406. The connecting tabs 404 project or protrude beyond the metal body 102 because the latter provides the recesses 302 at the positions of the connecting tabs 404. Other exemplary embodiments in which a connecting tab projects beyond a metal body without recesses having been formed for it in the metal body are clearly evident.

Figure 5:
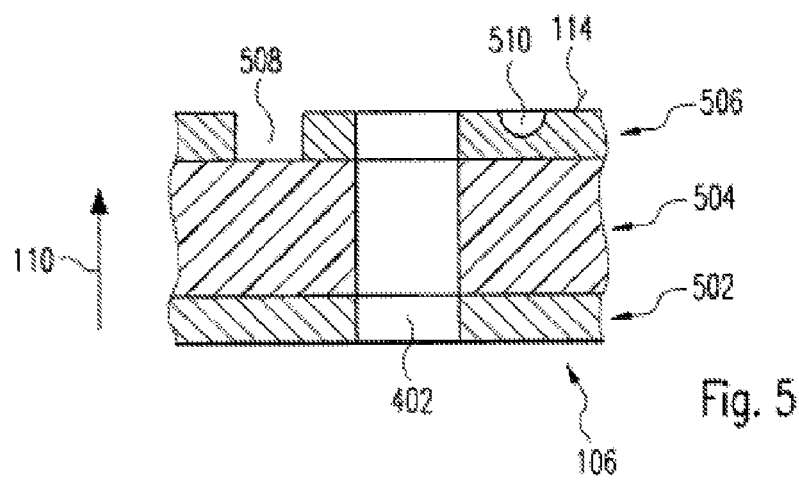
FIG. 5 a schematic section through the multi-layer supplementary circuit board of the component from FIG. 1.

On its underside 114, the supplementary circuit board 106 comprises plating, for example, gold plating, for the embodiment of conductor lines, a ground connection etc. The plating can be implemented, for example, before the attachment of the supplementary circuit board 106 to the metal body 102. Corresponding methods are known, for example, from the field of printed-circuit board manufacture and will therefore not be discussed in detail here. FIG. 5 shows schematically a section through the supplementary circuit board 106, for example, in the region around one of the boreholes 402 from FIG. 4.

In this region, the supplementary circuit board 106 comprises a series of layers 502, 504, 506 in the direction towards the underside 114 (compare the arrow 110 with the meaning as discussed with regard to FIG. 1). The layer 504 can form a base of the supplementary circuit board 106 and can be formed from a base material, such as a per se known printed-circuit board material or circuit-board material, a laminate material etc. The material of the layer 504 can have electrically insulating properties.

The layer 502 contacting the metal body 102 can comprise, for example, the bond layer 108 (FIG. 1). The layer 506 on the underside 114 of the supplementary circuit board 106 can be made from a conducting material, such as gold, a gold alloy etc. The layer 506 can be structured for the formation of lines, for example, conductor lines or strip lines, as indicated by the channel 508.

In step 208 of the method from FIG. 2, and, once again, with reference to FIG. 4, the chip 104 is bonded in order to contact the supplementary circuit board 106. For example, a wire bonding can be implemented, as suggested with wire contacts 408 in FIG. 4. The step 208 can further comprise an assembly, in which the components 118 (compare also FIG. 1) are assembled on the supplementary circuit board 106. Additionally or alternatively, a cover, for example, in the form of a cap or a lid 410 for the protection of the chip 104, for example, from mechanical damage during assembly of the component 100 can be attached, for example, by soldering or bonding.

The attachment of surface-mounted elements such as the components 118 or the lid 410 on the supplementary circuit board 106 can also be implemented completely or partially before the attachment of the supplementary circuit board 106 to the metal body 102, for example, in a separate fitting process of the supplementary circuit board 106. The components 118 and/or the cover 410 can be SMD elements which can be fitted in an SMT process.

Soldering regions can be provided on the underside 114 of the supplementary circuit board 106 for the subsequent attachment of the component 100 to a printed-circuit board. Corresponding soldering surfaces or soldering points are provided on the corresponding plating for signal routing, for ground connection etc. As an example, a soldering position or respectively a soldering point is indicated in FIG. 5 in the form of an indentation or recess 510, which is introduced into the plating 506. During a fitting of a printed-circuit board with the component 100, the indentation 510 can be provided in order to receive soldering paste, which leads to a soldering of component 100 and printed-circuit board in a subsequent reflow process.

Additionally or alternatively, soldering regions can also be provided by depositing solder on the underside 114 of the supplementary circuit board, or can also be provided simply by keeping free the optionally plated underside 114 of components or other surface-mounted elements.

Figure 6:
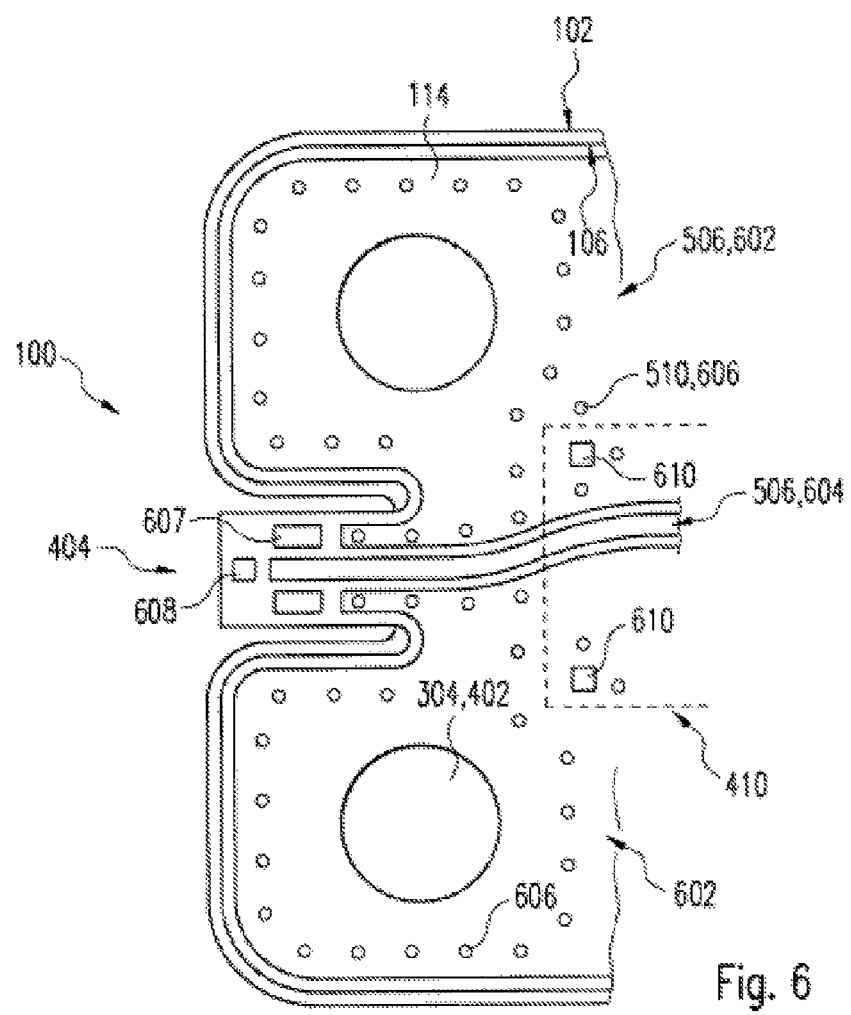
FIG. 6 a plan of the component from FIG. 1 in partial view from below.

FIG. 6 shows a detail 412 (compare FIG. 4) of the component 100 in a plan view. The metal body 102 is fitted with the supplementary circuit board 106. The plating 506, which embodies the flat regions 602 and a signal line 604, is applied to the underside 114 of the supplementary circuit board 106.

The supplementary circuit board embodies the connecting tab 404. Boreholes 304, 402 are also illustrated. Soldering points 606, 607 are prepared in the surface plating 602 through indentations 510. At the positions of the soldering points 606, 607, the component 100 can be soldered to a printed-circuit board in order to apply a ground potential to the component 100. Such soldering points 607 can also be disposed in the region of the connecting tab 404.

The signal line 604 extends between the connecting tab 404 and the chip 104 (compare FIG. 4 in this regard). A soldering surface 608 is provided in the signal line 604 in the region of the connecting tab 404. At this position, the signal line 604 can be soldered to the corresponding signal line on the printed-circuit board. The signal line 604 can be embodied as a strip line. Together with the ground connection via the soldering positions 607, a GCPW-GCPW transition can therefore be realised between the component 100 and the printed-circuit board.

Suggested support positions 610 serve for the attachment by means of soldering of the lid 410 (compare also FIG. 4) for the protection of the chip 104. The lid 410 can be made from a synthetic material and can comprise a structure supported by the support positions 610, distanced from the chip 104 and the underside 112 of the supplementary circuit board, for example, in the form of a solid or hollow semi-cylinder, cuboid or brick.

The manufacturing method 200 for the manufacture of the component 100 ends in step 210, for example, in that the component 100 is coated, marked up and packed etc.

Figure 7:
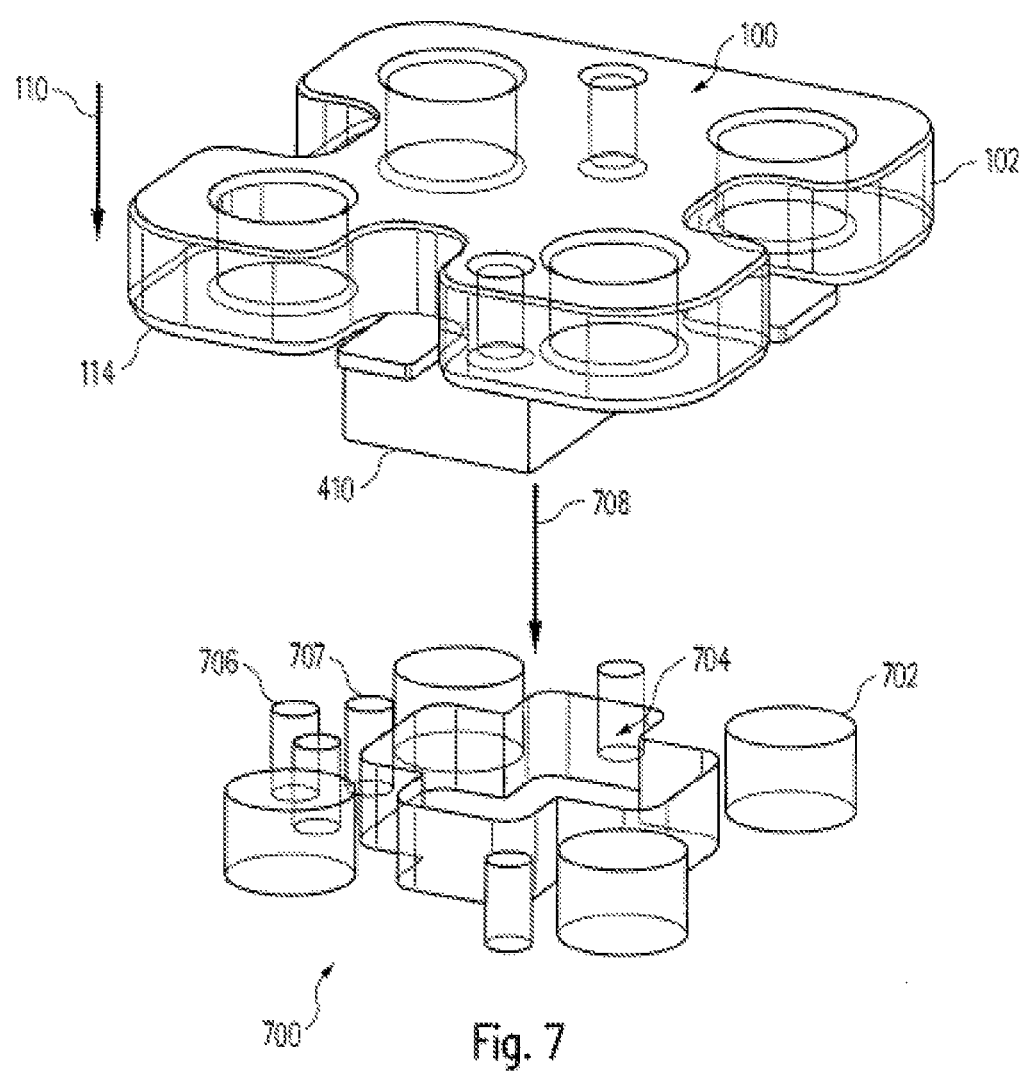
FIG. 7 a schematic perspective view of a printed-circuit board with the component from the preceding Figs. before fitting.

FIG. 7 shows the component 100 from the preceding drawings above a printed-circuit board 700. With reference to the flow diagram in FIG. 8, an exemplary process 800 for the assembly of the component 100 on the printed-circuit board 700 will now be described. The component 100 can be processed like a conventional SMD product. Accordingly, aspects of the method 800 can be based entirely or partially on per se known SMT processes.

In step 802, the printed-circuit board 700 is prepared. By way of difference from the present discussion, step 802 can also be implemented as an autonomous process, independently from the other steps of the method 800.

Boreholes 702 and a recess 704 are introduced into the printed-circuit board 700 illustrated schematically in FIG. 7.

In this context, the boreholes 702 in cooperation with the boreholes 304, 402 of the component 100 serve for its screw connection to the printed-circuit board 700 and/or to a more comprehensive component group. Although six boreholes 702 are shown in FIG. 7, only four, only two, or even no boreholes, may also be provided. Even with six openings 702 provided, only four, or only two or even no openings 702 are also used under some circumstances. Without any other attachment, the component 100 may also be attached to the printed-circuit board 700 only via a soldered connection.

The recess 704 can be introduced into the printed-circuit board 700, for example, by milling. The recess 704 serves to retain surface-mounted elements on the metal body 102 and/or the supplementary circuit board 106 during the fitting of the component 100 onto the printed-circuit board 700, that is, for example, the lid 410 and/or the components 118 as shown in FIG. 4. Instead of only one recess 704, several separate recesses can also be provided. The recess 704 can extend through the entire depth or thickness of the printed-circuit board 700, or can extend only partially into the printed-circuit board 700.

In step 804 of the method 800, a soldering paste is applied to at least one soldering region of the printed-circuit board. The soldering regions provided for the soldering of the component to the printed-circuit board 700 can be provided as flat soldering faces and/or punctually as soldering points or positions. By way of example, FIG. 7 shows some soldering surfaces 706, 707, which correspond to the soldering positions 608 or respectively 607 indicated on the underside 114 of the supplementary circuit board 106 in FIG. 6. By way of difference from FIG. 7, a plurality of soldering positions on the printed-circuit board 700 can be provided with soldering paste, wherein the soldering positions can correspond to the soldering positions 606 indicated in FIG. 6.

The soldering paste can be applied to the soldering surfaces 706, 707, for example, by means of a paste printing method, using stencil printing, screen printing or through-printing processes, with the assistance of pens, rollers or pneumatically, by means of jet-printing etc. In other methods, soldering regions on the component are also, additionally or alternatively, provided with soldering paste.

In step 806, the component 100 is placed onto the printed-circuit board 700 coated with the soldering paste, as indicated by the arrow 708. The arrow 110 discussed with reference to FIG. 1 and reproduced in FIG. 7 shows that the component 100 is placed upside down by comparison with its presentation in FIGS. 1 and 3-6. In particular, the underside 112 of the supplementary circuit board 106 is placed onto the printed-circuit board 700; the metal body 102 is accordingly facing away from the printed-circuit board 700. The chip 104 is disposed above or respectively on or in the recess 704. The lid 410 extends into the recess 704.

The recess 704 and/or the surface-mounted elements on the underside 112 of the metal body 102 and/or the underside 114 of the supplementary circuit board 106 should be dimensioned in such a manner that the surface-mounted elements are spaced within the recess 704 away from the printed-circuit board 700 and/or other components, for example, of a more comprehensive component group after an assembly of the component 100 on the printed-circuit board 700. The provision of a spacing distance between fixed elements on the rear side of the component 100 and the milling 704 of the printed-circuit board allows a flexible, for example, elastic behaviour of the component 100 between chip 104 and the soldering positions 608, 607 or respectively 706, 707 in the region of the connecting tab 404.

The fitting is implemented in such a manner that the component 100 adheres to the printed-circuit board 700 by means of the soldering paste provided on the soldering positions 706, 707. For the fitting of a plurality of printed-circuit boards in each case with at least one component, the semiconductor component 100 can be supplied for fitting in a taped form. Corresponding methods, such as are used, for example, for conventional SMD components are already known to the person skilled in the art.

In step 808, the printed-circuit board 700 with attached component 100 is supplied for reflow soldering. The soldering serves for the mechanical fastening of the component 100 on the printed-circuit board 700 and/or for the electrical connection of the component 100 to the printed-circuit board 700. In this respect, FIG. 9 shows a partial perspective view of the component 100 placed on the printed-circuit board 700.

With the positioned component 100, only the connecting tab 404 is visible from the supplementary circuit board 106 below the metal body 102 in the recess 302 of the metal body 102. The component 100 can be surface soldered to the printed-circuit board 700, as indicated by the arrow 902. This can be implemented, for example, via the plurality of soldering points 606 provided on the supplementary circuit board 106 (compare FIG. 6). Additionally or alternatively, the component 100 can be screw connected to the printed-circuit board 700 via the screw holes 304, wherein the screw connection has not yet been implemented at the stage of FIG. 9.

Figure 9:
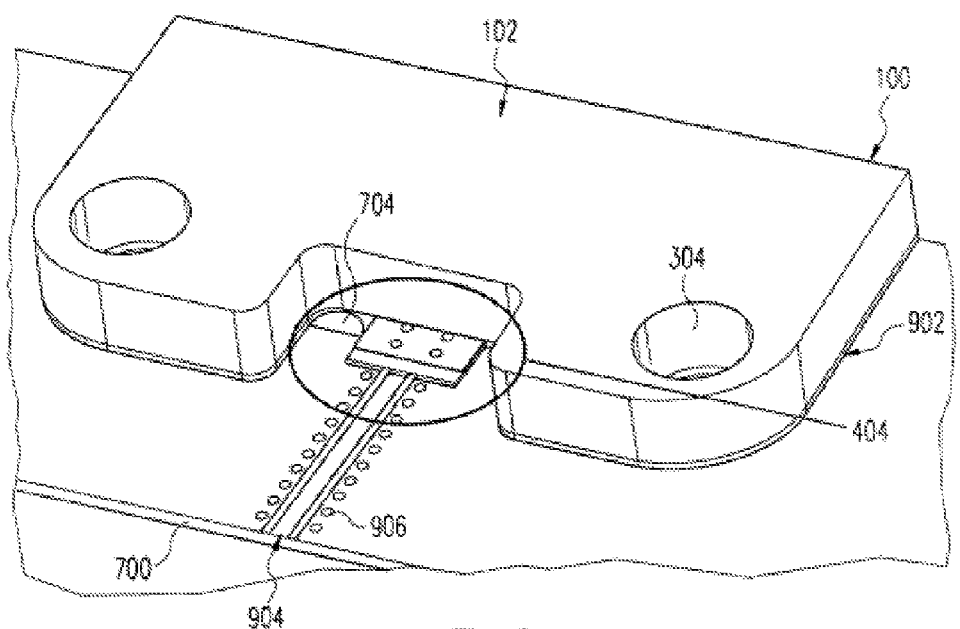
FIG. 9 the printed-circuit board from FIG. 7 with mounted component in a detail view.

In the exemplary view in FIG. 9, the recess 704 of the printed-circuit board 700 is not completely covered by the metal body 102 or the supplementary circuit board 106. Only the connecting tab 404 of the supplementary circuit board 106 bridges the recess 704. This leads to the elastic behaviour of the component 100 discussed several times above. The connecting tab 404 serves for the electrical contacting of the component 100 with a signal line 904 and a ground 906 of the printed-circuit board 700.

Figure 10:
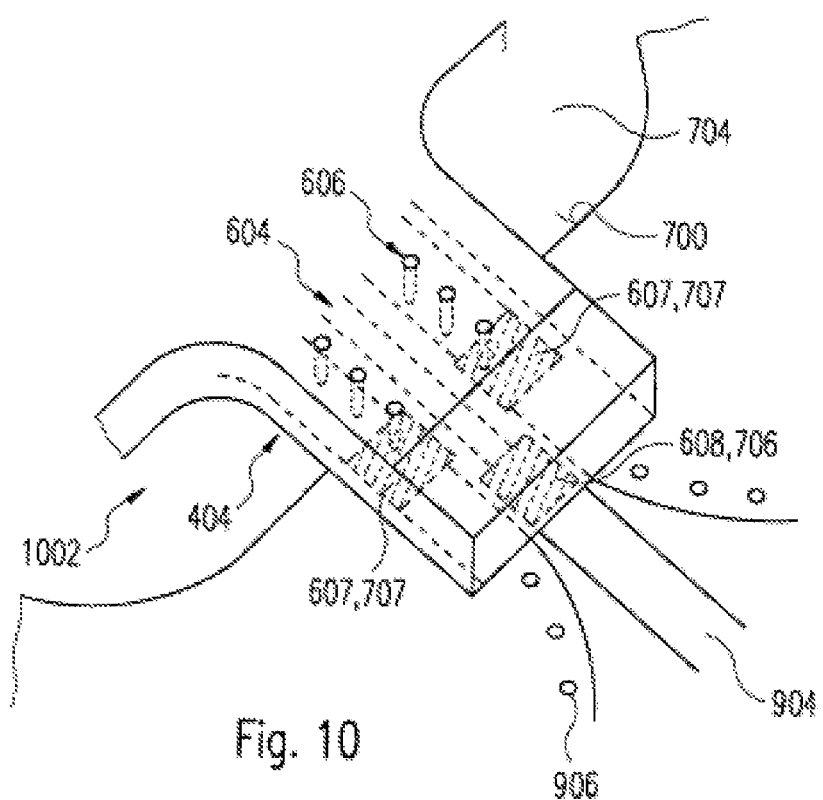
FIG. 10 a partial view of the configuration from FIG. 9 with details of the connecting tab of the component.

FIG. 10 shows, in partially transparent view, the region around the connecting tab 404 from FIG. 9 with further details. In this region, only the elastic connecting tab 404 is in contact at the edge of the milling 704 of the application plate 700, which leads to the elastic action described above. In particular, the flexible tab 404 can compensate mutual mechanical displacements of the printed-circuit board 700 and component 100, which can occur at high temperatures during soldering and/or during operation. This prolongs the operating life of soldered contacts, such as the soldering positions shown in FIG. 10.

The signal line 604 of the package 100 contacts the signal line 904 of the printed-circuit board 700 via the corresponding soldering positions 608 and 706. The signal lines 604 and 904 can be lines which are embodied for high-frequency signal routing, that is, for example, appropriately embodied strip lines. The ground 606 of the package 100 contacts the ground 906 of the application plate 700 via the corresponding soldering positions 607 and 707.

In the reflow process 808, the component 100 is soldered at the soldering positions 607/707 and 608/706 to the printed-circuit board 700. The connecting tab 404 has only a low heat capacity, since the metal body 102 of the component 100 is withdrawn at this position, compare with the preceding drawings. A melting of the soldering paste at the positions 706 and 707 is accordingly facilitated and the reflow process is simplified.

Figure 8:
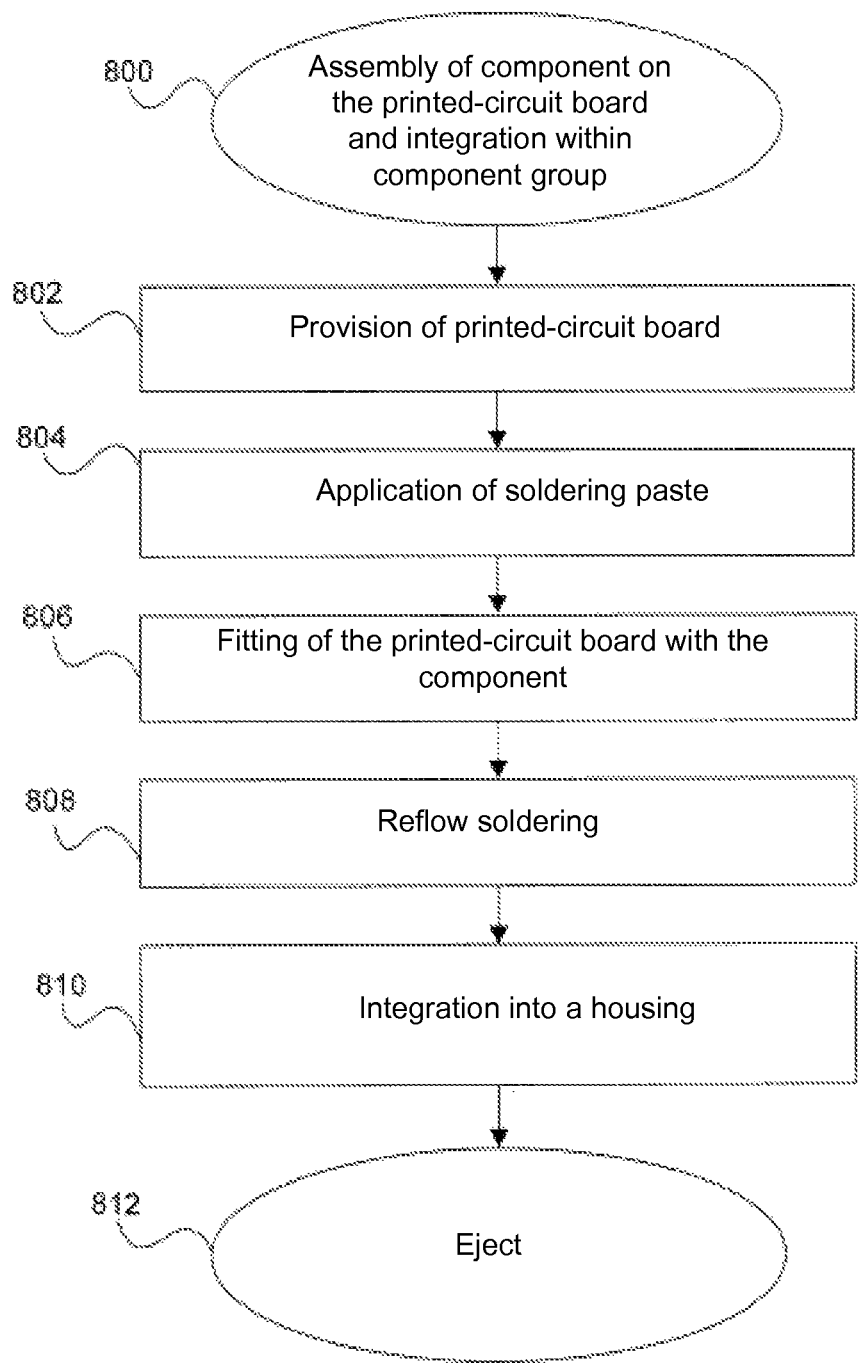
FIG. 8 a flow diagram visualising an exemplary method for the fitting of the printed-circuit board from FIG. 7.
Figure 11:
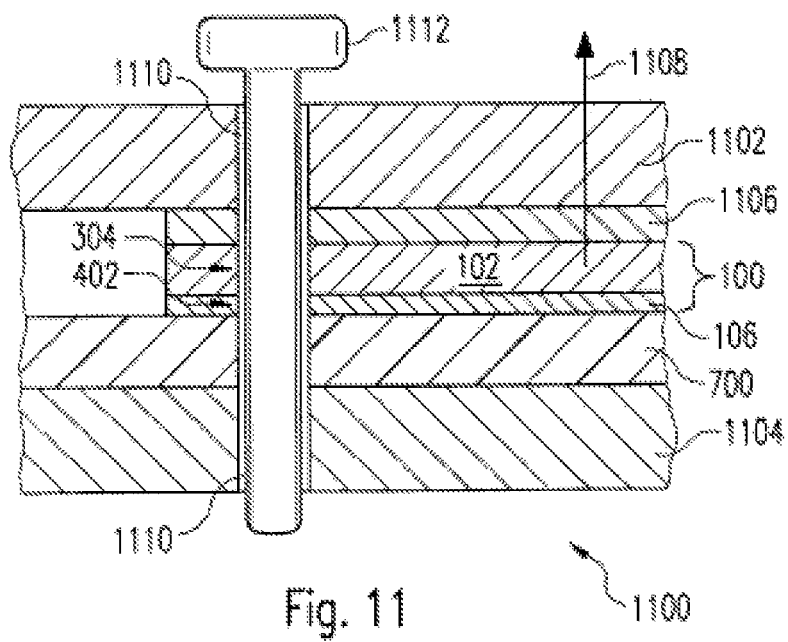
FIG. 11 a schematic cross-sectional view of a component group in which the printed-circuit board with the component from the preceding Figs. has been introduced.

In step 810 in FIG. 8, the arrangement of the printed-circuit board 700 and the soldered and/or screw-connected component 100 is accommodated in a housing. In this context, FIG. 11 shows a component group 1100 in a schematic lateral section and partial view. The printed-circuit board 700 bears the component 100, of which only the metal body 102 and the supplementary circuit board 106 disposed below it are visible in the illustrated section; that is, the chip 102, recess 704 of the printed-circuit board and surface-mounted elements on the supplementary circuit board 106 are disposed outside the sectional view.

The printed-circuit board 700 and component 100 are accommodated in the housing 1100 between an upper part 1102 and a lower part 1104, wherein the designations "upper part" and respectively "lower part" are selected arbitrarily. The housing 1100 can be formed from a metallic and/or non-metallic material. For example, for efficient heat removal, a metallic material such as aluminium or an aluminium alloy can be used. In the simplified example shown in FIG. 11, both the upper part 1102 and also the lower part 1104 are substantially flat, although other housing shapes are also conceivable. On the outside, the housing 1100 can provide, for example, cooling fins and/or other devices for heat removal, for mechanical or electrical connection etc., which are not shown in FIG. 11.

The printed-circuit board 700 is in contact with the lower part 1104, wherein other configurations, in which, for example, the printed-circuit board 700 is disposed on one or more spacers, ribs, plinths, springs or other structural elements which can be present in the interior of the housing 1100, are also conceivable. A layer 1106 is disposed between the metal body 102 of the component 100 and the housing upper part 1102. This layer can be provided for the thermal coupling of the component 100 and/or for its mechanical fixing within the housing 1100. For the efficient thermal coupling of the component 100 and especially its metal body 102, a material with high thermal conductivity can be selected, which fills the intermediate cavity between the metal body 102 and the housing part 1102 without gaps. For example, a thermoplastic, duroplastic and/or an elastomer material can be used.

After the fitting together of the housing 1100, a preferred heat flow occurs upwards from the component, as indicated by the arrow 1108, that is, via the metal body 102, the layer with high thermal conductivity 1106 and the housing part 1102. In particular, this heat flow 1108 occurs not via the printed-circuit board 700, which is therefore heated comparatively little during the operation of the embedded chip 104, especially by comparison with conventional arrangements, in which a heat flow preferably passes from a package via a printed-circuit board to external cooling devices.

The fitting together of the housing can comprise a screw connection. For this purpose, boreholes 1110 are provided in the housing parts 1102 and 1104, which correspond to the boreholes 304/402 in the component 100 and to the borehole 702 in the printed-circuit board 700 (with other exemplary embodiments in which the component provides no boreholes, or the component and the printed-circuit board provide no boreholes, only the housing parts themselves are screw connected to one another). A screw 1112 can be guided through the corresponding boreholes. In addition or as an alternative to the screw connection indicated in FIG. 11, different forms or further forms of fitting together are conceivable, for example, a bonding, locking or screw connection of the housing parts 1102 and 1104.

The assembly method 800 shown in FIG. 8 ends with step 812. The component group 1100 obtained with the component 100 mounted on the printed-circuit board 700 can, for example, be printed, packed and distributed.

In each of the exemplary embodiments described above, an individual chip is accommodated in the component or respectively on the metal body for heat removal (the optional presence of further components with insignificant power consumption or respectively waste heat is not considered here). Different exemplary embodiments relate to a component with several chips for heat removal. For example, two, three, six or even more chips can be accommodated on one metal body. These chips can, for example, all be connected to a metal body as described above for the example from FIG. 1. The chips can be identical chips or also different chips, for example, different power modules.

The metal body of such a component has correspondingly larger dimensions than a metal body for the accommodation, assembly and/or heat removal of only one chip. Such metal bodies and/or supplementary circuit boards can have dimensions within the range of several centimeters. For example, a metal body for the accommodation of six power modules of typical size can have a metal plate with dimensions of 60 mm×40 mm (or more).

Such components can comprise at least one supplementary circuit board, which is provided for the connection of at least two or more of the chips to the printed-circuit board by means of reflow soldering. Currently preferred exemplary embodiments comprise a single supplementary circuit board for the connection of all chips. As already described, this supplementary circuit board would, on the one hand, assume the functions of individual supplementary circuit boards, and would also ensure an accurate positioning of the component and/or of the chip.

For example, a component in the form of a component group or respectively an assembly with several power modules, which allows a good heat removal through the large metal body, can be provided in this manner, wherein an automated fitting is possible at the same time.

Exemplary embodiments of such component groups can have dimensions which extend up to and beyond the dimensions of the main printed-circuit board.

The invention is not restricted to the exemplary embodiments described here and the aspects emphasised therein; on the contrary, within the scope indicated by the attached claims, a plurality of variations are possible which are disposed within the range of activities of the person skilled in the art. In particular, given combinations of features described separately above will be evident as expedient or advantageous to the person skilled in the art.

What is claimed:

1. A semiconductor component, comprising
   a metal body on at least one chip and a supplementary circuit board,
   wherein the supplementary circuit board is provided on an underside facing away from the metal body for connection with a printed-circuit board by operations including soldering,
   wherein the supplementary circuit board provides at least one connecting tab for the electrical connection of the component to the printed-circuit board, and
   wherein the connecting tab provides at least one strip line for signal routing, which is provided for attachment by operations including reflow soldering to the strip line of the printed-circuit board.

2. The semiconductor component according to claim 1, wherein the supplementary circuit board at least partially surrounds the chip in the form of a frame.

3. The semiconductor component according to claim 1, wherein the supplementary circuit board is fitted on the underside with at least one semiconductor element.

4. The semiconductor component according to claim 1, wherein the connecting tab is movable in an elastic manner perpendicular to a printed-circuit board surface.

5. The semiconductor component according to claim 1, wherein the metal body exposes the connecting tab of the supplementary circuit board by a structure including a recess.

6. The semiconductor component according to claim 1, wherein the connecting tab comprises a plated insulating material.

7. The semiconductor component according to claim 1, wherein the connecting tab provides on the underside at least one reflow soldering position for signal routing between component and printed-circuit board or at least one reflow soldering position for the ground connection between component and printed-circuit board.

8. The semiconductor component according to claim 1, wherein the soldering is reflow soldering.

9. A printed-circuit board with semiconductor component according to claim 1,
wherein the supplementary circuit board of the semiconductor component is connected to the printed-circuit board by reflow soldering, and
wherein surface-mounted elements on at least one of the metal body or on the supplementary circuit board of the semiconductor component are accommodated in a recess of the printed-circuit board.

10. The printed-circuit board according to claim 9,
wherein the surface-mounted elements on at least one of the metal body or on the supplementary circuit board of the semiconductor component are accommodated in the recess of the printed-circuit board with spacing distance.

* * * * *